(12) United States Patent
Shimizu

(10) Patent No.: US 10,483,941 B2
(45) Date of Patent: Nov. 19, 2019

(54) ACOUSTIC WAVE DEVICE AND METHOD OF MANUFACTURING THE SAME

(71) Applicant: TAIYO YUDEN CO., LTD., Tokyo (JP)

(72) Inventor: Yohei Shimizu, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 330 days.

(21) Appl. No.: 15/388,188

(22) Filed: Dec. 22, 2016

(65) Prior Publication Data

US 2017/0201227 A1  Jul. 13, 2017

(30) Foreign Application Priority Data

Jan. 12, 2016 (JP) .................................. 2016-003701

(51) Int. Cl.
  *H03H 9/02* (2006.01)
  *H03H 9/64* (2006.01)
  *H01L 41/253* (2013.01)

(52) U.S. Cl.
  CPC .... *H03H 9/02614* (2013.01); *H03H 9/02866* (2013.01); *H03H 9/6483* (2013.01); *H01L 41/253* (2013.01)

(58) Field of Classification Search
  CPC combination set(s) only.
  See application file for complete search history.

(56) References Cited

U.S. PATENT DOCUMENTS

| 7,800,464 B2* | 9/2010 | Tajima | H03H 9/02559 |
| | | | 333/193 |
| 2004/0222717 A1* | 11/2004 | Matsuda | H03H 3/08 |
| | | | 310/313 R |
| 2007/0194662 A1* | 8/2007 | Sano | H03H 3/02 |
| | | | 310/324 |
| 2013/0049889 A1* | 2/2013 | Shimizu | H03H 3/10 |
| | | | 333/195 |
| 2014/0001917 A1* | 1/2014 | Yamashita | H01L 41/08 |
| | | | 310/313 A |

(Continued)

FOREIGN PATENT DOCUMENTS

| JP | H3-49312 A | 3/1991 |
| JP | 3-114310 A | 5/1991 |

(Continued)

OTHER PUBLICATIONS

Japanese Office Action dated Mar. 20, 2018, in a counterpart Japanese patent application No. 2016-003701. (A machine translation (not reviewed for accuracy) attached.).

(Continued)

*Primary Examiner* — Bryan P Gordon
(74) *Attorney, Agent, or Firm* — Chen Yoshimura LLP

(57) ABSTRACT

An acoustic wave device includes: a piezoelectric substrate; an IDT that is formed on the piezoelectric substrate and includes a pair of comb-shaped electrodes facing each other, each of the pair of comb-shaped electrodes including an grating electrode that excites an acoustic wave and a bus bar to which the grating electrode is connected; and reforming regions that are located only inside the piezoelectric substrate and arranged at intervals under the IDT, and in which a material of the piezoelectric substrate is reformed.

14 Claims, 15 Drawing Sheets

(56) References Cited

U.S. PATENT DOCUMENTS

2014/0038392 A1    2/2014  Yonehara et al.

FOREIGN PATENT DOCUMENTS

| JP | 2000-278090 A | 10/2000 |
| JP | 2004-336503 A | 11/2004 |
| JP | 2007-324513 A | 12/2007 |
| JP | 2013-46107 A  | 3/2013  |
| JP | 2014-11568 A  | 1/2014  |
| JP | 2015-516672 A | 6/2015  |

OTHER PUBLICATIONS

Japanese Office Action dated Oct. 23, 2018, in a counterpart Japanese patent application No. 2016-003701. (A machine translation (not reviewed for accuracy) attached.).

* cited by examiner

ACOUSTIC WAVE DEVICE AND METHOD OF MANUFACTURING THE SAME

CROSS-REFERENCE TO RELATED APPLICATION

This application is based upon and claims the benefit of priority of the prior Japanese Patent Application No. 2016-003701, filed on Jan. 12, 2016, the entire contents of which are incorporated herein by reference.

FIELD

A certain aspect of the present invention relates to an acoustic wave device and a method of manufacturing the same.

BACKGROUND

There has been known an acoustic wave device that includes an Interdigital Transducer (IDT) that excites an acoustic wave and is located on a piezoelectric substrate, and uses a surface acoustic wave propagating through the upper surface of the piezoelectric substrate. The acoustic wave device is light and small, and has a large attenuation to signals outside a predetermined frequency band, being used as a filter and a duplexer of a wireless communication device such as, for example, a mobile phone terminal.

In the acoustic wave device using the surface acoustic wave, a bulk wave propagating through the inside of the piezoelectric substrate is generated in addition to the surface acoustic wave when the IDT excites the surface acoustic wave. When the bulk wave is reflected by the lower surface of the piezoelectric substrate and reaches the upper surface, the characteristics of the acoustic wave device deteriorate. Thus, to inhibit the bulk wave from being reflected by the lower surface of the piezoelectric substrate and reaching the upper surface, the lower surface of the piezoelectric substrate may be made to be uneven as disclosed in Japanese Patent Application Publication No. 2000-278090, or a reforming layer may be formed on the lower surface of the piezoelectric substrate as disclosed in, for example, Japanese Patent Application Publication No. 3-114310.

In addition, there has been known a technique that adjusts vibration frequency by forming a reforming layer inside the piezoelectric substrate as disclosed in, for example, Japanese Patent Application Publication No. 2007-324513. In addition, there has been known a technique that inhibits a bulk wave from reaching one of adjacent resonators from the other by forming a reforming layer in a piezoelectric substrate between the adjacent resonators as disclosed in, for example, Japanese Patent Application Publication No. 2004-336503.

However, when protrusions and recesses or a reforming layer is located on the lower surface of the piezoelectric substrate to inhibit a bulk wave from being reflected by the lower surface of the piezoelectric substrate and reaching the upper surface, the strength of the piezoelectric substrate decreases.

SUMMARY OF THE INVENTION

According to a first aspect of the present invention, there is provided an acoustic wave device including: a piezoelectric substrate; an IDT that is formed on the piezoelectric substrate and includes a pair of comb-shaped electrodes facing each other, each of the pair of comb-shaped electrodes including an grating electrode that excites an acoustic wave and a bus bar to which the grating electrode is connected; and reforming regions that are located only inside the piezoelectric substrate and arranged at intervals under the IDT, and in which a material of the piezoelectric substrate is reformed.

According to a second aspect of the present invention, there is provided a method of manufacturing an acoustic wave device, the method including: forming an IDT on an upper surface of a piezoelectric substrate, the IDT including a pair of comb-shaped electrodes facing each other, each of the pair of comb-shaped electrodes including a grating electrode that excites an acoustic wave and a bus bar to which the grating electrode is connected; and forming reforming regions only inside the piezoelectric substrate so that the reforming regions are arranged at intervals under the IDT by irradiating the piezoelectric substrate with a laser beam from a lower surface side of the piezoelectric substrate.

DETAILED DESCRIPTION

Hereinafter, embodiments of the present invention will be described with reference to the accompanying drawings.

First Embodiment

Figure 1A:
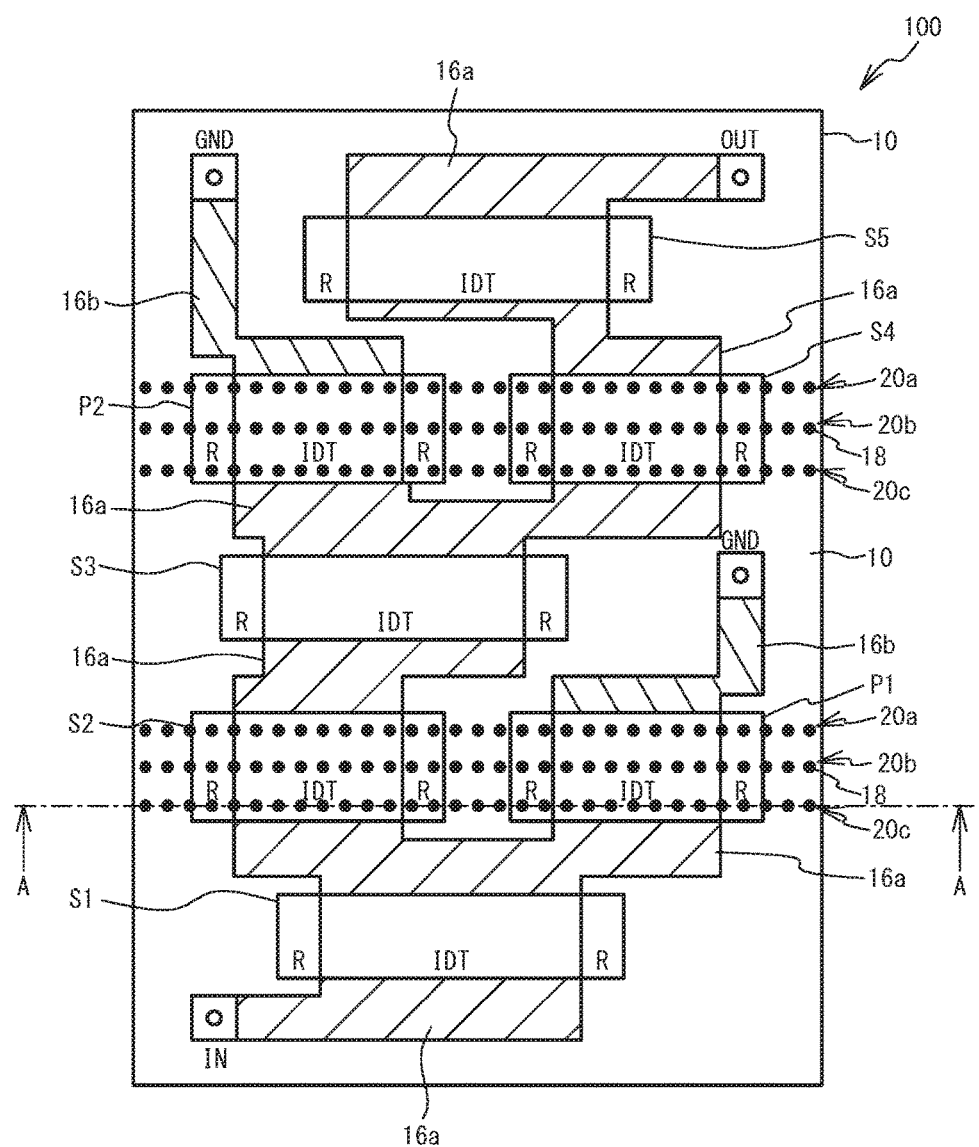
FIG. 1A is a plan view of an acoustic wave device in accordance with a first embodiment.
Figure 1B:
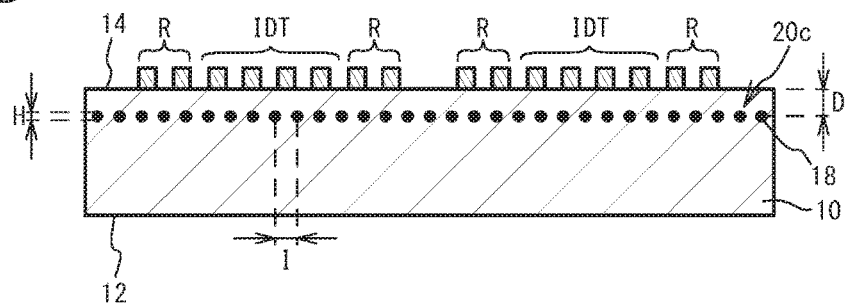
FIG. 1B is a cross-sectional view taken along line A-A in FIG. 1A.

FIG. 1A is a plan view of an acoustic wave device 100 in accordance with a first embodiment, and FIG. 1B is a cross-sectional view taken along line A-A in FIG. 1A. FIG. 1A omits the illustration of an Interdigital Transducer (IDT) and reflectors so that a reforming region can be easily seen. As illustrated in FIG. 1A and FIG. 1B, the acoustic wave device 100 of the first embodiment is a ladder-type filter in which one or more series resonators S1 through S5 are connected in series and one or more parallel resonators P1 and P2 are connected in parallel between an input electrode pad IN and an output electrode pad OUT. The series resonators S1 through S5 and the parallel resonators P1 and P2 are surface acoustic wave resonators. The series resonators S1 through S5 and the parallel resonators P1 and P2 are one-port resonators, and each of them includes an Interdigital Transducer (IDT) located on a piezoelectric substrate 10 and reflectors R located at both sides of the IDT. The piezoelectric substrate 10 is, for example, a 42° rotated Y-cut X-propagation lithium tantalate (LT) substrate with a thickness of 100 to 150 µm. The IDT and the reflectors R are made of a metal film such as, for example, aluminum (Al).

Figure 2:
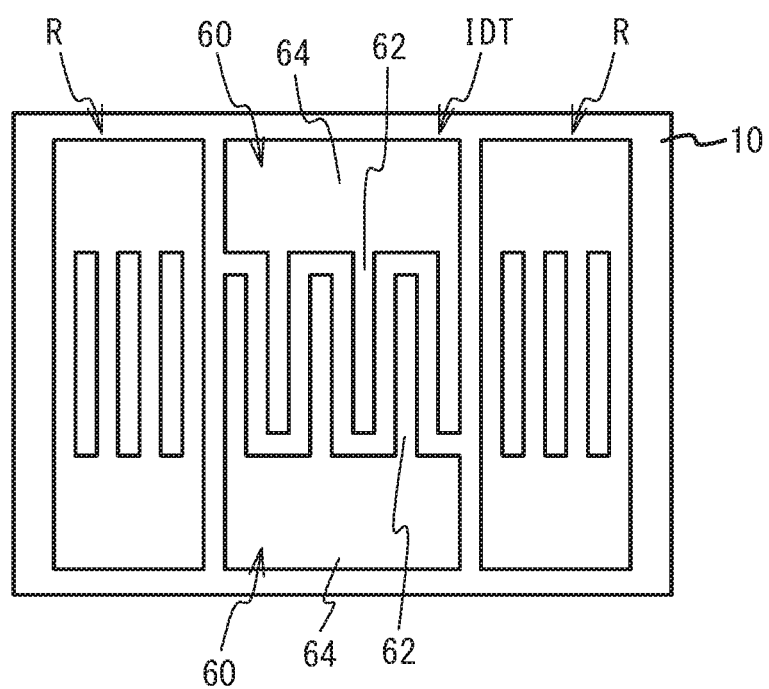
FIG. 2 is a plan view of a surface acoustic wave resonator.

Here, a surface acoustic wave resonator will be described in detail. FIG. 2 is a plan view of a surface acoustic wave resonator. As illustrated in FIG. 2, the surface acoustic wave resonator includes, on the piezoelectric substrate 10, an IDT and reflectors R located at both sides of the IDT in the propagation direction of the surface acoustic wave. The IDT includes a pair of comb-shaped electrodes 60 facing each other. Each of the pair of comb-shaped electrodes 60 includes a plurality of grating electrodes (electrode fingers) 62 and a bus bar 64 to which the grating electrodes 62 are connected. The grating electrodes 62 of one of the pair of comb-shaped electrodes 60 and the grating electrodes 62 of the other are arranged, for example, alternately. The grating electrodes 62 excite acoustic waves on the surface of the piezoelectric substrate 10. The reflector R reflects the acoustic wave. Each of the pair of comb-shaped electrodes 60 may include a dummy electrode finger coupled to the bus bar 64.

As illustrated in FIG. 1A and FIG. 1B, a first end of the IDT of the series resonator S1 is coupled to the input electrode pad IN through a signal wiring line 16a. A second end of the IDT of the series resonator S1 is coupled to first ends of the IDTs of the series resonator S2 and the parallel resonator P1 through the signal wiring line 16a. A second end of the IDT of the series resonator S2 is coupled to a first end of the IDT of the series resonator S3 through the signal wiring line 16a. A second end of the IDT of the parallel resonator P1 is coupled to a ground electrode pad GND through a ground wiring line 16b. A second end of the IDT of the series resonator S3 is coupled to first ends of the IDTs of the series resonator S4 and the parallel resonator P2 through the signal wiring line 16a. A second end of the IDT of the series resonator S4 is coupled to a first end of the IDT of the series resonator S5 through the signal wiring line 16a. A second end of the IDT of the parallel resonator P2 is coupled to the ground electrode pad GND through the ground wiring line 16b. A second end of the IDT of the series resonator S5 is coupled to the output electrode pad OUT through the signal wiring line 16a.

In the series resonators S2 and S4 and the parallel resonators P1 and P2, a plurality of reforming regions 18 are dotted in the piezoelectric substrate 10 immediately under the IDT without being exposed to a lower surface 12 and an upper surface 14 of the piezoelectric substrate 10. That is, the reforming regions 18 are located only in the piezoelectric substrate 10 and arranged at intervals under the IDT. No reforming region 18 is located in the piezoelectric substrate 10 immediately under the IDTs of the series resonators S1, S3, and S5. The reforming region 18 is a region in which the material of the piezoelectric substrate 10 is reformed by heat of a laser beam by irradiating the piezoelectric substrate 10 with a laser beam. The reforming region 18 has an amorphous structure. The case where a plurality of reforming regions 18 are located at intervals under the IDT includes not only a case where a plurality of reforming regions 18 are located under a plurality of grating electrodes 62 but also a case where a plurality of reforming regions 18 are located between a plurality of grating electrodes 62.

The reforming regions 18 are located along a line in the propagation direction of the acoustic wave, and form a first reforming region group 20a, a second reforming region group 20b, and a third reforming region group 20c that are arranged in a direction intersecting the propagation direction of the acoustic wave. The first reforming region group 20a and the third reforming region group 20c are located near the edges of the IDT in the direction intersecting the propagation direction of the acoustic wave, and the second reforming region group 20b is located near the center of the IDT.

The reforming regions 18 of the first through third reforming region groups 20a through 20c are located approximately at the same depth in the piezoelectric substrate 10. The height H of the reforming region 18 is, for example, 3 to 8 µm. The interval I between the reforming regions 18 is, for example, 4 to 16 µm. The depth D from the upper surface 14 of the piezoelectric substrate 10 to the center of the reforming region 18 is, for example, 5 to 90 µm.

Figure 3A:
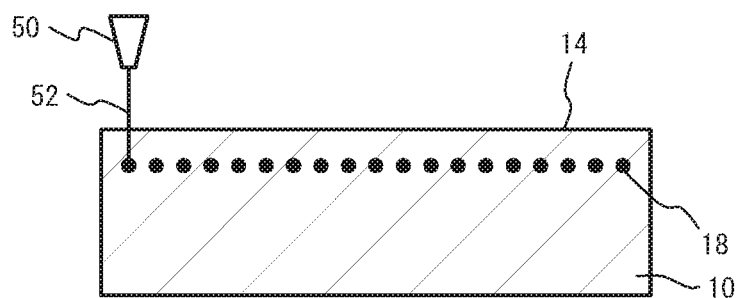
FIG. 3A and FIG. 3B are cross-sectional views illustrating a first manufacturing method of the acoustic wave device of the first embodiment.
Figure 3B:
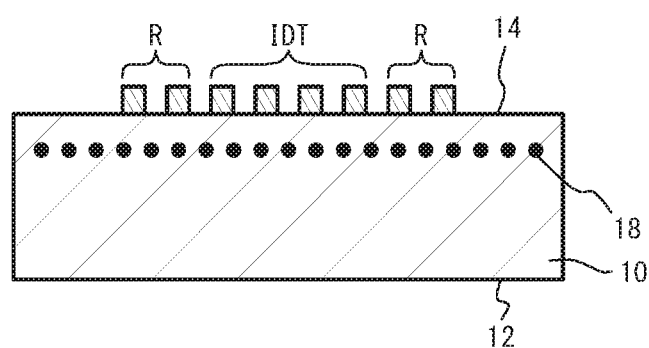
Figure 3C:
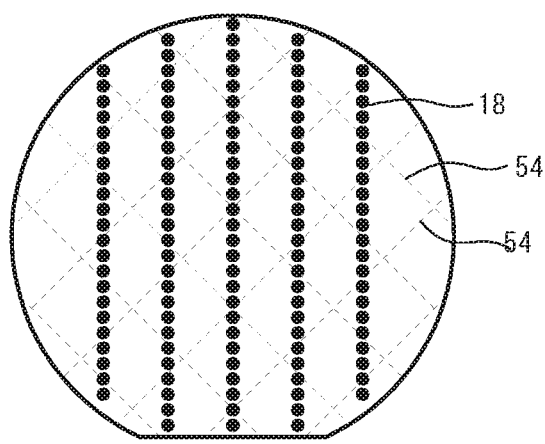
FIG. 3C is a plan view illustrating the first manufacturing method.

A method of manufacturing the acoustic wave device 100 of the first embodiment will be described next. FIG. 3A and FIG. 3B are cross-sectional views illustrating a first manufacturing method of the acoustic wave device 100 of the first embodiment, and FIG. 3C is a plan view illustrating the first manufacturing method. As illustrated in FIG. 3A and FIG. 3C, a laser irradiation apparatus 50 irradiates the piezoelectric substrate 10 with a laser beam 52 from the upper surface 14 side of the piezoelectric substrate 10 in a wafer state. This process forms the reforming regions 18 in which the material of the piezoelectric substrate 10 is reformed by heat of the laser beam 52. For example, when a stealth laser device irradiates the piezoelectric substrate 10 with the laser beam 52 moving at 360 mm/sec and having an output power of 0.01 W, the reforming regions 18 with a height H of approximately 3 to 8 µm, an interval I of approximately 8 µm, and a depth D of approximately 11 µm are formed (see FIG. 1B for the height H, the interval I, and the depth D).

The piezoelectric substrate 10 is irradiated with the laser beam 52 so that the reforming regions 18 are formed along a line in a direction different from a cleavage direction 54 of the piezoelectric substrate 10. When the piezoelectric substrate 10 is a 42° rotated Y-cut X-propagation LT substrate and a direction perpendicular to an orientation flat corresponds to the X-axis direction of the crystal orientation of the piezoelectric substrate 10, a direction tilted at approximately 45° to the orientation flat is the cleavage direction 54. In this case, the reforming regions 18 are to be formed along a line in the direction perpendicular to the orientation flat (i.e., the X-axis direction of the crystal orientation of the piezoelectric substrate 10). The reforming regions 18 formed along a line in a direction different from the cleavage direction 54 of the piezoelectric substrate 10 can reduce the occurrence of chipping or cracks in the piezoelectric substrate 10.

The laser beam 52 is, for example, a green laser beam, and is, for example, a second harmonic of a Nd:YAG laser. The use of a laser beam with a wavelength of approximately 500 nm allows the reforming regions 18 to be efficiently formed in the piezoelectric substrate 10. The wavelength of the laser beam 52 can be appropriately set depending on the material of the piezoelectric substrate 10.

As illustrated in FIG. 3B, an IDT and reflectors R are formed on the piezoelectric substrate 10 by a typical method. At this time, aligning markers (not illustrated) formed on the piezoelectric substrate 10 are used to form the IDT and the reflectors R immediately above the reforming regions 18. Wiring lines and electrode pads are also formed on the piezoelectric substrate 10 by a typical method. Then, the piezoelectric substrate 10 in a wafer state is separated into individual chips by, for example, dicing to form the acoustic wave devices 100 of the first embodiment.

Figure 4A:
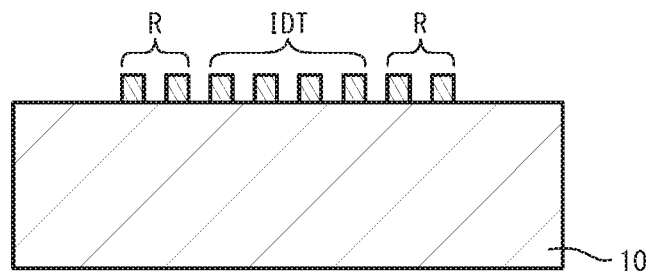
FIG. 4A through FIG. 4C are cross-sectional views illustrating a second manufacturing method of the acoustic wave device of the first embodiment.
Figure 4B:
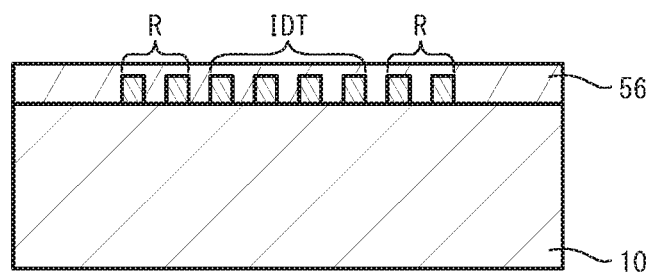
Figure 4C:
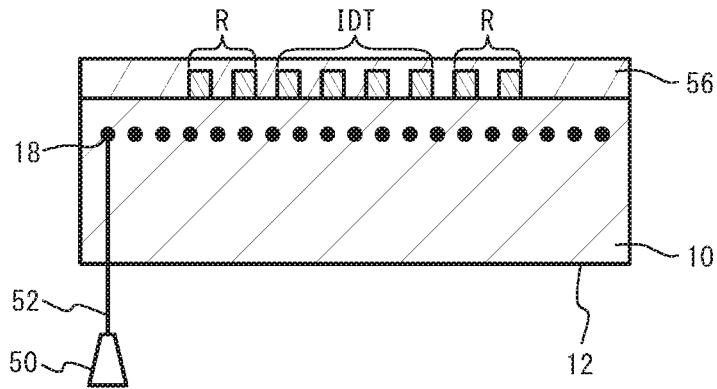

FIG. 4A through FIG. 4C are cross-sectional views illustrating a second method of manufacturing the acoustic wave device 100 of the first embodiment. As illustrated in FIG. 4A, IDTs, reflectors R, wiring lines, and electrode pads are formed on the piezoelectric substrate 10 in a wafer state by a typical method. As illustrated in FIG. 4B, a protection tape 56 for protecting the IDTs is formed on the piezoelectric substrate 10.

As illustrated in FIG. 4C, the laser irradiation apparatus 50 irradiates the piezoelectric substrate 10 with the laser beam 52 from the lower surface 12 side of the piezoelectric substrate 10 to form the reforming regions 18. When the lower surface 12 of the piezoelectric substrate 10 is a mirror surface, the reforming regions 18 can be formed by irradiating the piezoelectric substrate 10 with the laser beam 52 from the lower surface 12 side of the piezoelectric substrate 10. At this time, the IDT formed on the piezoelectric substrate 10 is used as an aligning marker to form the reforming regions 18 so that the reforming regions 18 are located immediately under the IDT. The reforming regions 18 are formed along a line in a direction different from the cleavage direction 54 of the piezoelectric substrate 10 as described in FIG. 3C. Then, the piezoelectric substrate 10 in a wafer state is separated into individual chips by, for example, dicing to form the acoustic wave devices 100 of the first embodiment.

Figure 5:
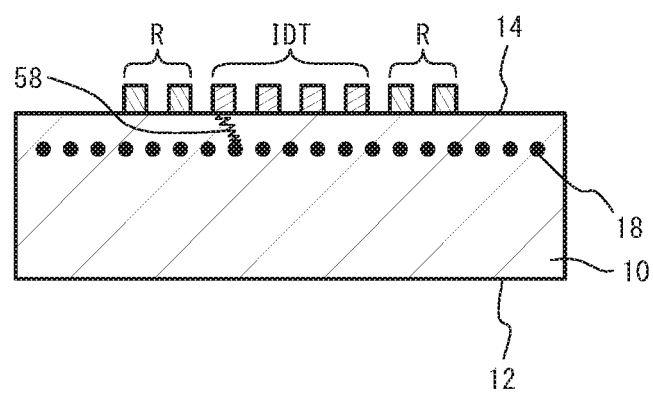
FIG. 5 is a diagram for describing an effect of a reforming region located in a piezoelectric substrate under an IDT.

In the first embodiment, the reforming regions 18 are located in the piezoelectric substrate 10 and arranged at intervals under the IDT as illustrated in FIG. 1A and FIG. 1B. The reforming region 18 has, for example, an amorphous structure. FIG. 5 is a diagram for describing the effect of the reforming regions 18 located in the piezoelectric substrate 10 under the IDT. When the reforming regions 18 are located in the piezoelectric substrate 10 under the IDT as illustrated in FIG. 5, a bulk wave 58 generated in accordance with the excitation of the surface acoustic wave by the IDT is attenuated by the reforming region 18. Thus, the bulk wave 58 is inhibited from being reflected by the lower surface 12 of the piezoelectric substrate 10 and reaching the upper surface 14, and the filter characteristics can be thus improved. When recesses and protrusions or a reforming layer is formed on the lower surface of the piezoelectric substrate, the lower surface of the piezoelectric substrate is damaged. Thus, chipping or cracks easily occur when a force is applied to the lower surface of the piezoelectric substrate. The occurrence of chipping or cracks in the piezoelectric substrate becomes remarkable as the piezoelectric substrate is thinned. However, in the first embodiment, the reforming regions 18 are located only in the piezoelectric substrate 10. Thus, the lower surface 12 of the piezoelectric substrate 10 can be mirrored, and the decrease in strength of the piezoelectric substrate 10 can be reduced.

Figure 6:
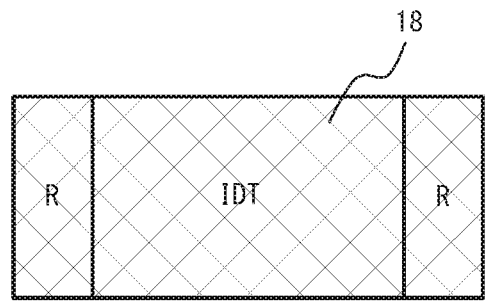
FIG. 6 is a plan view of a part of an acoustic wave device in accordance with a first variation of the first embodiment.

FIG. 6 is a plan view of a part of an acoustic wave device in accordance with a first variation of the first embodiment. FIG. 6 omits the illustration of IDTs and reflectors so that the reforming region can be easily seen. As illustrated in FIG. 6, in the acoustic wave device of the first variation of the first embodiment, the reforming region 18 covers the entire region in the piezoelectric substrate 10 immediately under the IDT. Other configurations are the same as those of the first embodiment, and thus the description is omitted. In the first variation of the first embodiment, since the reforming region 18 covers the entire region in the piezoelectric substrate 10 immediately under the IDT, the bulk wave 58 is effectively attenuated by the reforming region 18. In contrast, in the first embodiment, the reforming regions 18 are dotted in the piezoelectric substrate 10 immediately under the IDTs as illustrated in FIG. 1A. This configuration can reduce the area of the region in which the reforming regions 18 are formed and thus can enhance the strength of the piezoelectric substrate 10 compared to the configuration that provides the reforming region 18 covering the entire region in the piezoelectric substrate 10 immediately under the IDT.

In addition, the first embodiment provides the reforming regions 18 along a line in a direction different from the cleavage direction 54 of the piezoelectric substrate 10 as described in FIG. 3C. This configuration can reduce the occurrence of chipping or cracks in the piezoelectric substrate 10.

In addition, in the first embodiment, the reforming regions 18 are located closer to the upper surface 14 than to the middle of the piezoelectric substrate 10 in the thickness direction of the piezoelectric substrate 10 as illustrated in FIG. 1B. This configuration can attenuate the bulk wave 58 traveling from the upper surface 14 toward the lower surface 12 and also effectively attenuate the bulk wave 58 that is reflected by the side surface of the piezoelectric substrate 10 and travels toward the upper surface 14. The reforming regions 18 are preferably located within a quarter of, more preferably one-sixth of, further preferably one-eighth of the thickness of the piezoelectric substrate 10 from the upper surface 14 of the piezoelectric substrate 10.

The first embodiment does not provide the reforming region 18 immediately under a wiring line or an electrode pad. This is because the reforming region 18 located immediately under the wiring line and the electrode pad is not very effective in attenuating the bulk wave 58. When the reforming region 18 is located immediately under the wiring line and the electrode pad, the area of the region where the reforming region 18 is formed increases although the reforming region 18 under the wiring line and the electrode pad is not very effective in attenuating the bulk wave 58. Thus, chipping or cracks easily occur in the piezoelectric substrate 10. Therefore, the reforming region 18 may be located only immediately under the IDT, and may not be necessarily located in other regions.

In addition, the first embodiment forms an IDT on the piezoelectric substrate 10, and then irradiates the piezoelectric substrate 10 with the laser beam 52 from the lower surface 12 side of the piezoelectric substrate 10 to form the reforming regions 18 as illustrated in FIG. 4A through FIG. 4C. This manufacturing method can use the IDT as an aligning marker, and thus can easily form the reforming regions 18 in the piezoelectric substrate 10 immediately under the IDT.

Figure 7A:
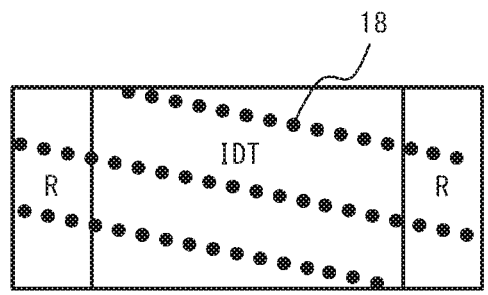
FIG. 7A through FIG. 7C are plan views of a part of each of acoustic wave devices in accordance with second through fourth variations of the first embodiment, respectively.
Figure 7B:
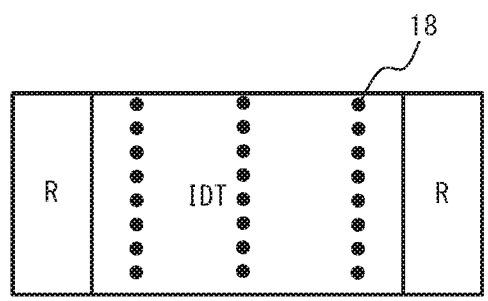
Figure 7C:
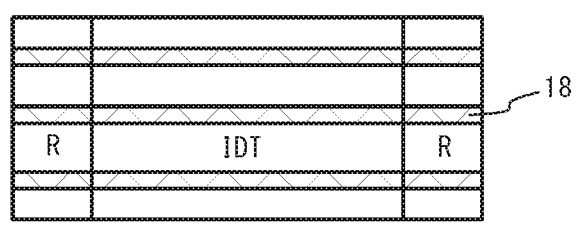

In the first embodiment, to reduce the decrease in strength of the piezoelectric substrate 10, the reforming regions 18 are preferably not exposed to the lower surface 12 of the piezoelectric substrate 10 nor to the side surface. The reforming regions 18 may be located along a line in the propagation direction of the acoustic wave as illustrated in FIG. 1A, or may be located along a line in a direction tilted from the propagation direction of the acoustic wave as illustrated in a second variation of the first embodiment of FIG. 7A. In this case, the reforming regions 18 are preferably located along a line in a direction that does not overlap the cleavage direction 54 of the piezoelectric substrate 10. As illustrated in a third variation of the first embodiment of FIG. 7B, the reforming regions 18 may be located along a line in the direction intersecting the propagation direction of the acoustic wave. As illustrated in a fourth variation of the first embodiment of FIG. 7C, the reforming regions 18 may be located as a block extending in the propagation direction of the acoustic wave. FIG. 7A through FIG. 7C omit the illustration of IDTs and reflectors so that the reforming region can be easily seen.

In the first embodiment, the reforming regions 18 may be located in the piezoelectric substrate 10 immediately under the IDTs of the series resonators S1, S3, and S5. That is, when a plurality of resonators are provided, it is only required that the reforming regions 18 are located in the piezoelectric substrate 10 immediately under the IDT of at least one resonator, and the reforming regions 18 may be located in the piezoelectric substrate 10 immediately under the IDTs of all resonators. In the piezoelectric substrate 10 immediately under one IDT, the first through third reforming region groups 20a through 20c may be located, one reforming region group may be located, or two or more than three reforming region groups may be located. Since the bulk wave 58 is large near the center of the IDT in a direction intersecting the propagation direction of the acoustic wave, the reforming regions 18 are preferably located in the piezoelectric substrate 10 immediately under the vicinity of the center of the IDT. The interval between the reforming regions 18 located along a line is preferably less than the wavelength of the bulk wave 58 to effectively attenuate the bulk wave 58.

The first embodiment has described an exemplary case where the piezoelectric substrate 10 is a 42° rotated Y-cut X-propagation LT substrate, but the piezoelectric substrate 10 may be other piezoelectric substrate. The piezoelectric substrate 10 may be, for example, a 36° to 48° rotated Y-cut X-propagation LT substrate, or a 64° or 128° rotated Y-cut X-propagation lithium niobate substrate (LN substrate).

Second Embodiment

Figure 8:
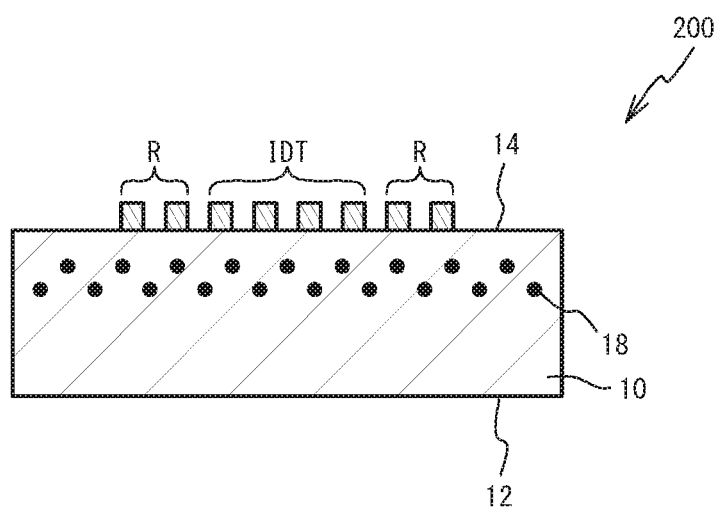
FIG. 8 is a cross-sectional view of an acoustic wave device in accordance with a second embodiment.

FIG. 8 is a cross-sectional view of an acoustic wave device 200 in accordance with a second embodiment. As illustrated in FIG. 8, in the acoustic wave device 200 of the second embodiment, the reforming regions 18 located along a line are located at two or more different depths in the piezoelectric substrate 10. The reforming regions 18 may be located at two or more different depths while repeating a predetermined pattern, or may be randomly located at two or more different depths. Other configurations are the same as those of the first embodiment, and thus the description is omitted.

In the second embodiment, the reforming regions 18 are located at two or more different depths in the piezoelectric substrate 10. This configuration can reduce the occurrence of chipping or cracks in the piezoelectric substrate 10 compared to the configuration in which the reforming regions 18 are located at the same depth.

Third Embodiment

Figure 9:
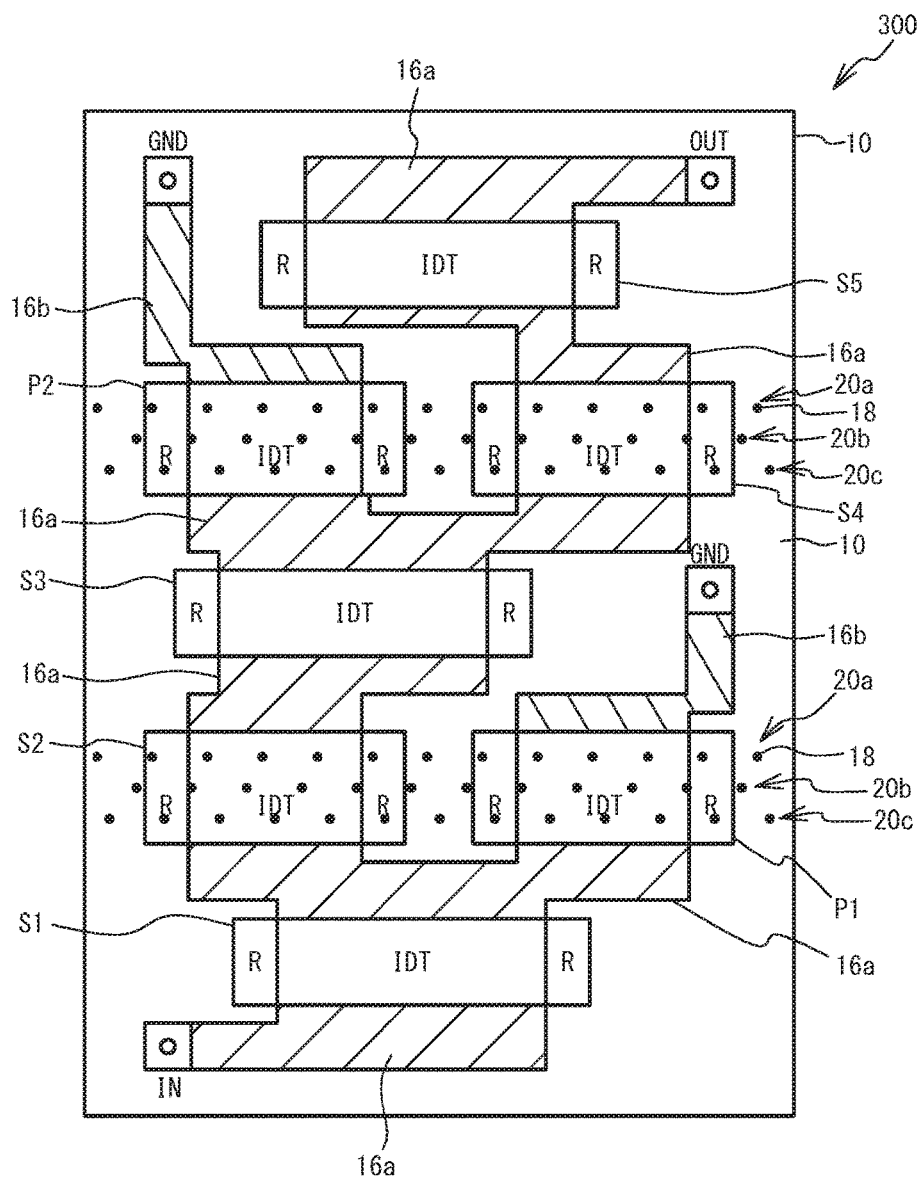
FIG. 9 is a plan view of an acoustic wave device in accordance with a third embodiment.

FIG. 9 is a plan view of an acoustic wave device 300 in accordance with a third embodiment. FIG. 9 omits the illustration of IDTs and reflectors so that the reforming region can be easily seen. FIG. 9 illustrates smaller number of reforming regions 18 than those of the first embodiment. As illustrated in FIG. 9, the reforming regions 18 of the first reforming region group 20a and the reforming regions 18 of the second reforming region group 20b are located so as not to overlap each other as viewed from a direction intersecting the propagation direction of the acoustic wave. The reforming regions 18 of the second reforming region group 20b and the reforming regions 18 of the third reforming region group 20c are located so as not to overlap each other as viewed from the direction intersecting the propagation direction of the acoustic wave. As described above, the reforming regions 18 of the reforming region groups adjacent to each other in the direction intersecting with the propagation direction of the acoustic wave are formed so as not to be next to each other as viewed from the direction intersecting the propagation direction of the acoustic wave. Other configurations are the same as those of the first embodiment, and thus the description is omitted.

In the third embodiment, the reforming regions 18 of the first reforming region group 20a and the reforming regions 18 of the second reforming region group 20b are located so as not to overlap each other as viewed from the direction intersecting with the propagation direction of the acoustic wave. This configuration can inhibit, even when the first reforming region group 20a and the second reforming region group 20b are located next to each other, the reforming regions 18 from being located next to each other in the cleavage direction 54 of the piezoelectric substrate 10, and can reduce the occurrence of chipping or cracks in the piezoelectric substrate 10.

Fourth Embodiment

Figure 10:
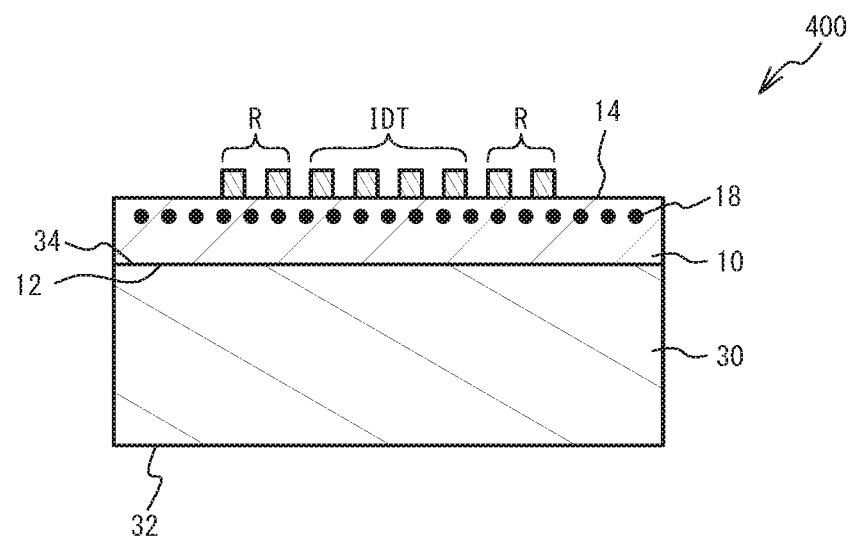
FIG. 10 is a cross-sectional view of an acoustic wave device in accordance with a fourth embodiment.

FIG. 10 is a cross-sectional view of an acoustic wave device 400 in accordance with a fourth embodiment. As illustrated in FIG. 10, in the acoustic wave device 400 of the fourth embodiment, an upper surface 34 of a support substrate 30 is bonded on the lower surface 12 of the piezoelectric substrate 10. At the boundary between the piezoelectric substrate 10 and the support substrate 30, atoms composing the piezoelectric substrate 10 and atoms composing the support substrate 30 form an amorphous layer, firmly bonding the piezoelectric substrate 10 on the support substrate 30. The support substrate 30 is an insulating substrate such as, for example, a sapphire substrate. The piezoelectric substrate 10 is, for example, a 42° rotated Y-cut X-propagation LT substrate as described above. The thickness of the support substrate 30 is, for example, 100 to 300 µm. The thickness of the piezoelectric substrate 10 is, for example, 20 to 100 µm.

When the piezoelectric substrate 10 is a 42° rotated Y-cut X-propagation LT substrate, the X-axis direction of the crystal orientation is defined as a first direction, and a direction intersecting the first direction (for example, a perpendicular direction) is defined as a second direction, the linear expansion coefficient in the first direction (approximately 16.1 ppm/° C.) is greater than the linear expansion coefficient in the second direction (approximately 9.5 ppm/° C.). In contrast, when the support substrate 30 is a sapphire substrate, the linear expansion coefficient in the first direction and the linear expansion coefficient in the second direction are approximately the same (7 ppm/° C.). The reforming regions 18 are located along a line in the first direction in which the linear expansion coefficient of the piezoelectric substrate 10 is greater. Other configurations are the same as those of the first embodiment, and thus the description is omitted.

Figure 11A:
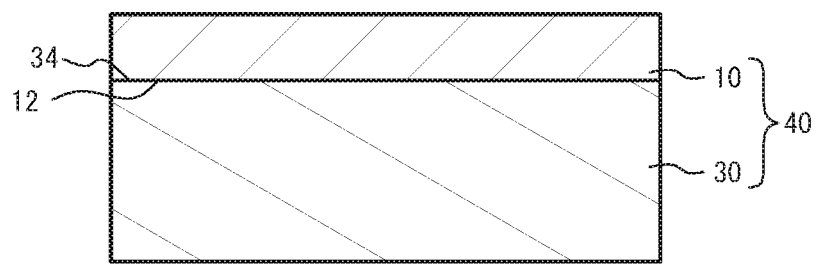
FIG. 11A through FIG. 11C are cross-sectional views illustrating a first method of manufacturing the acoustic wave device of the fourth embodiment.
Figure 11B:
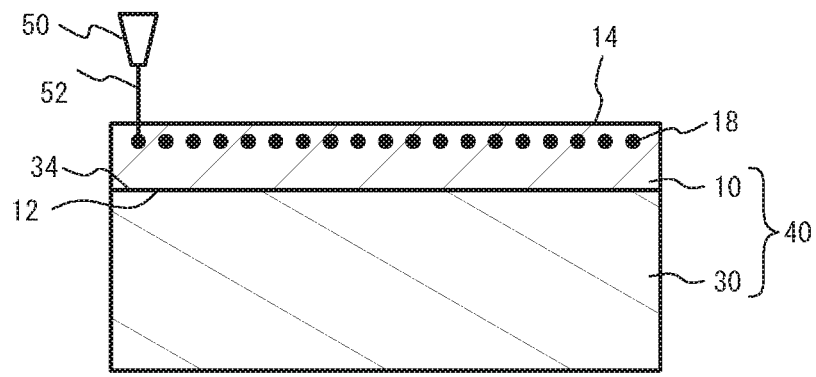
Figure 11C:
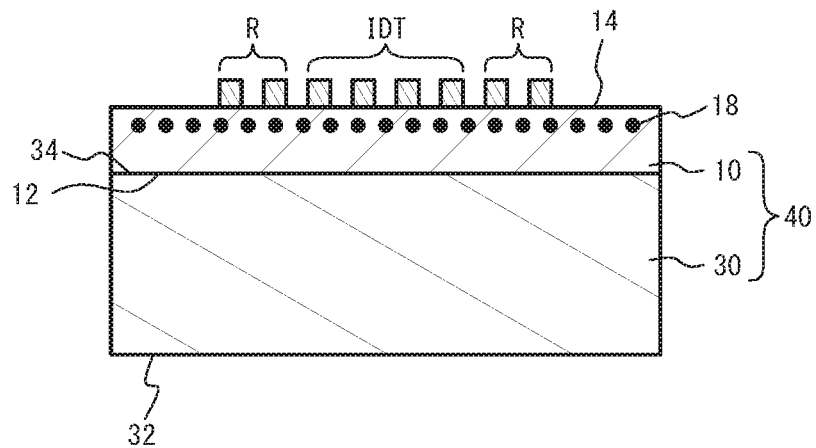

A method of manufacturing the acoustic wave device 400 of the fourth embodiment will be described next. FIG. 11A through FIG. 11C are cross-sectional views illustrating a first method of manufacturing the acoustic wave device 400 of the fourth embodiment. As illustrated in FIG. 11A, prepared is a bonded substrate 40 in a wafer state formed by bonding the upper surface 34 of the support substrate 30 on the lower surface 12 of the piezoelectric substrate 10 and thinning the piezoelectric substrate 10 into a desired thickness by polishing.

As illustrated in FIG. 11B, the laser irradiation apparatus 50 irradiates the piezoelectric substrate 10 with the laser beam 52 from the upper surface 14 side of the piezoelectric substrate 10 to form the reforming regions 18.

As illustrated in FIG. 11C, IDTs, reflectors R, wiring lines, and electrode pads are formed on the piezoelectric substrate 10 by a typical method. Then, the bonded substrate 40 in a wafer state is separated into individual chips by, for example, dicing to form the acoustic wave devices 400 of the fourth embodiment.

Figure 12A:
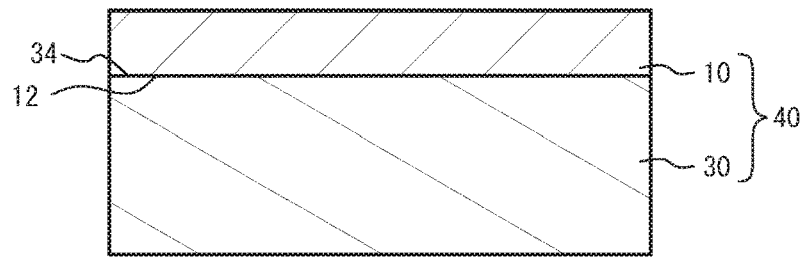
FIG. 12A through FIG. 12D are cross-sectional views illustrating a second method of manufacturing the acoustic wave device in accordance with the fourth embodiment.

FIG. 12A through FIG. 12D are cross-sectional views illustrating a second method of manufacturing the acoustic wave device 400 of the fourth embodiment. As illustrated in FIG. 12A, prepared is the bonded substrate 40 in a wafer state formed by bonding the lower surface 12 of the piezoelectric substrate 10 on the upper surface 34 of the support substrate 30 and thinning the piezoelectric substrate 10 into a desired thickness by polishing.

Figure 12B:
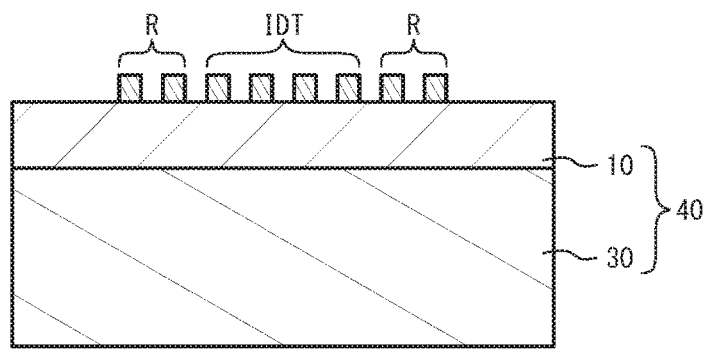
Figure 12C:
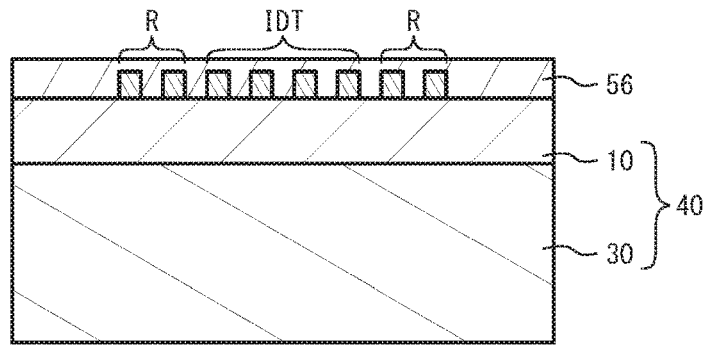

As illustrated in FIG. 12B, IDTs, reflectors R, wiring lines, and electrode pads are formed on the piezoelectric substrate 10 by a typical method. As illustrated in FIG. 12C, the protection tape 56 for protecting the IDTs and the like is formed on the piezoelectric substrate 10.

Figure 12D:
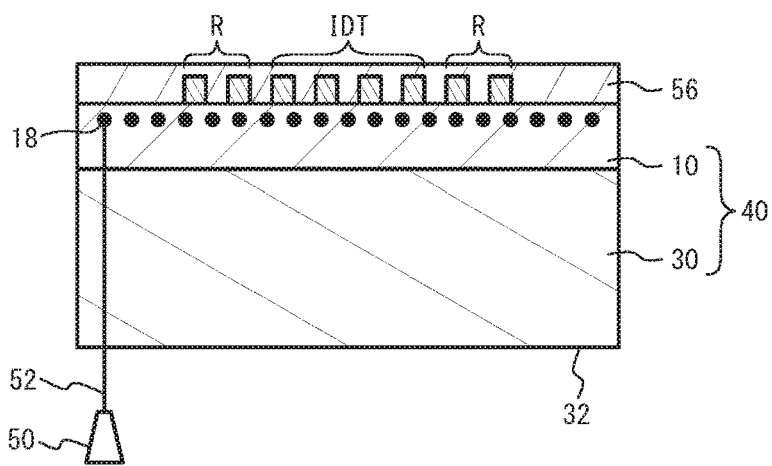

As illustrated in FIG. 12D, the laser irradiation apparatus 50 irradiates the piezoelectric substrate 10 with the laser beam 52 from a lower surface 32 side of the support substrate 30 to form the reforming regions 18. When the lower surface 32 of the support substrate 30 is a mirror surface, the reforming regions 18 can be formed by irradiating the piezoelectric substrate 10 with the laser beam 52 from the lower surface 32 side of the support substrate 30. At this time, as described in the first embodiment, the IDT formed on the piezoelectric substrate 10 is used as an aligning marker so that the reforming regions 18 are formed so as to be located immediately under the IDT. Then, the bonded substrate 40 in a wafer state is separated into individual chips by, for example, dicing to form the acoustic wave devices 400 of the fourth embodiment.

Figure 13:
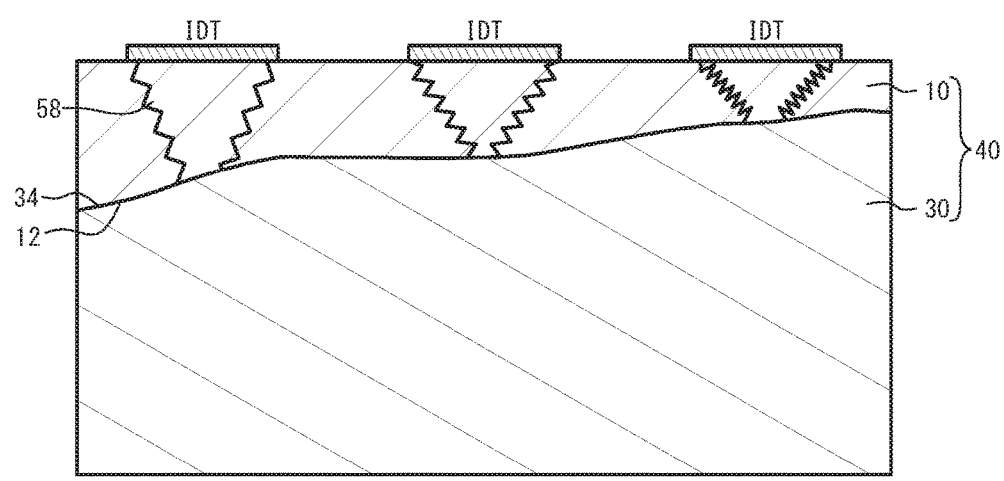
FIG. 13 is a diagram for describing a bulk wave when a bonded substrate in which a piezoelectric substrate and a support substrate are bonded to each other is used and a reforming region is not located in the piezoelectric substrate.

Here, with use of FIG. 13, described is the bulk wave 58 when the bonded substrate 40 in which the piezoelectric substrate 10 and the support substrate 30 are bonded to each other is used and the reforming region 18 is not located in the piezoelectric substrate 10. As illustrated in FIG. 13, since the flatness of the upper surface 34 of the support substrate 30 is bad, the thickness of the piezoelectric substrate 10 greatly varies in a wafer. Thus, at a location where the piezoelectric substrate 10 is thick, the effect of the bulk wave 58 reflected by the lower surface 12 of the piezoelectric substrate 10 is small, while at a location where the piezoelectric substrate 10 is thin, the effect of the bulk wave 58 may be large. As described above, when the bonded substrate 40 in which the piezoelectric substrate 10 and the support substrate 30 are bonded to each other is used, the degree of influence of the bulk wave 58 varies in a wafer, and may adversely affect the chip yield ratio.

Figure 14:
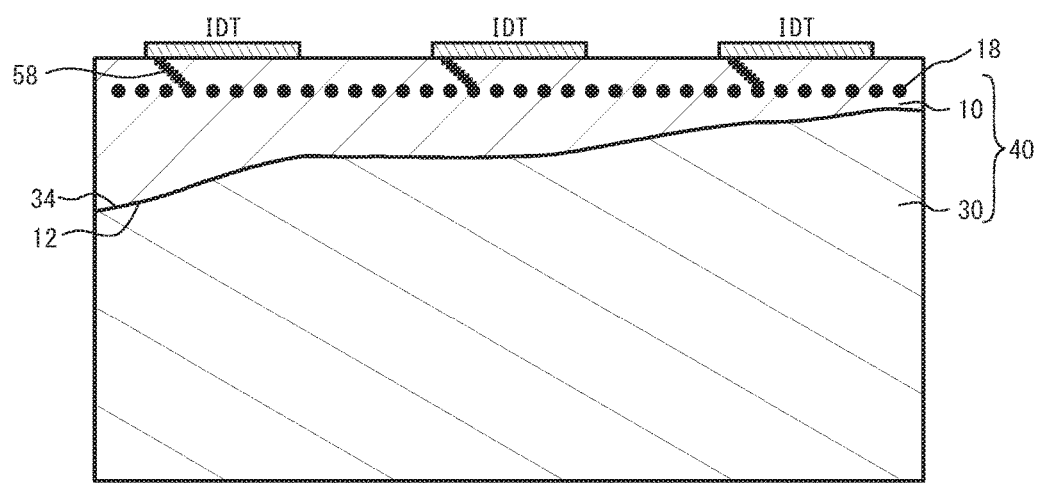
FIG. 14 is a diagram for describing an effect achieved by a reforming region located in a piezoelectric substrate when a bonded substrate in which the piezoelectric substrate and a support substrate are bonded to each other is used.

In contrast, in the fourth embodiment, the reforming regions 18 are located in the piezoelectric substrate 10. FIG. 14 is a diagram for describing an effect of the reforming regions 18 located in the piezoelectric substrate 10 when the bonded substrate 40 in which the piezoelectric substrate 10 and the support substrate 30 are bonded to each other is used. As illustrated in FIG. 14, since the bulk wave 58 is attenuated by the reforming region 18 regardless of the thickness of the piezoelectric substrate 10, the bulk wave 58 can be inhibited from being reflected by the lower surface 12 of the piezoelectric substrate 10, and the filter characteristics and the chip yield ratio can be improved. In addition, since the lower surface 12 of the piezoelectric substrate 10 is bonded on the support substrate 30, it is difficult to form a recess and a protrusion or a reforming layer on the lower surface 12 of the piezoelectric substrate 10. However, in the fourth embodiment, since the reforming regions 18 are not exposed to the lower surface 12 of the piezoelectric substrate 10, the bonding of the lower surface 12 of the piezoelectric substrate 10 to the upper surface 34 of the support substrate 30 is not disturbed.

Figure 15A:
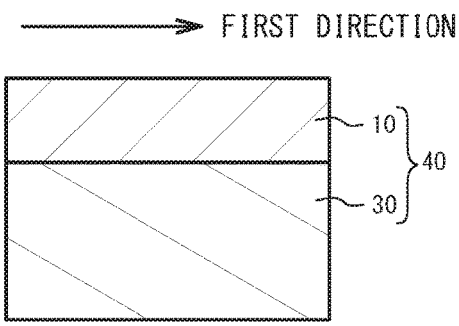
FIG. 15A through FIG. 15D are diagrams for describing an effect by a plurality of reforming regions located along a line in a first direction in which a linear expansion coefficient of the piezoelectric substrate is greater.
Figure 15B:
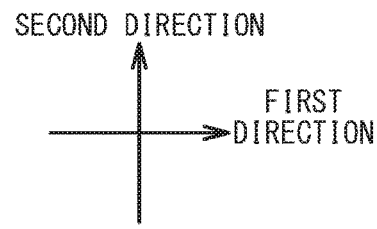
Figure 15C:
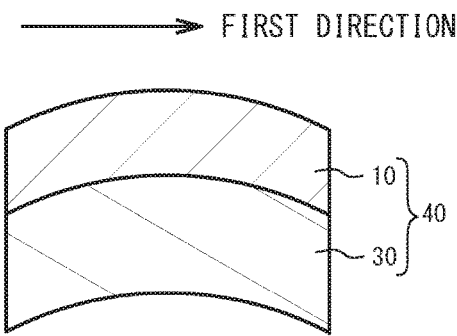
Figure 15D:
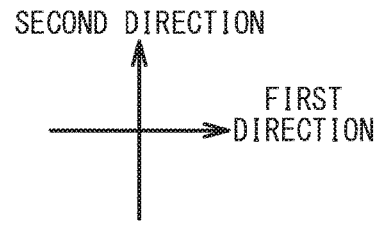

In addition, in the fourth embodiment, the piezoelectric substrate 10 has the linear expansion coefficient in the first direction (the X-axis direction of the crystal orientation in a 42° rotated Y-cut X-propagation LT substrate) greater than the linear expansion coefficient in the second direction intersecting the first direction. The support substrate 30 has approximately identical linear expansion coefficients in the first direction and the second direction. The reforming regions 18 are located along a line in the first direction in which the linear expansion coefficient of the piezoelectric substrate 10 is greater. FIG. 15A through FIG. 15D are diagrams for describing an effect of the reforming regions 18 located along a line in the first direction in which the linear expansion coefficient of the piezoelectric substrate 10 is greater. FIG. 15A and FIG. 15C are cross-sectional views of the bonded substrate 40, and FIG. 15B and FIG. 15D are plan views of the bonded substrate 40. In addition, FIG. 15A and FIG. 15B illustrate a state of the bonded substrate 40 at room temperature (for example, 25° C.), and FIG. 15C and FIG. 15D illustrate a state of the bonded substrate 40 at high temperature (for example, 80° C.). As illustrated in FIG. 15C and FIG. 15D, in the high temperature state, the linear expansion coefficient of the piezoelectric substrate 10 in the first direction is greater than that in the second direction, and the linear expansion coefficients of the support substrate 30 in the first direction and the second direction are approximately the same. Thus, the bonded substrate 40 warps so that the middle portion protrudes in the first direction. In this case, if the reforming regions 18 are formed along a line in the second direction, chipping or cracks starting from the reforming region 18 easily occur in the piezoelectric substrate 10 because of the warpage of the bonded substrate 40. In contrast, when the reforming regions 18 are formed along a line in the first direction as in the fourth embodiment, even when the bonded substrate 40 warps, the occurrence of chipping or cracks starting from the reforming region 18 is reduced in the piezoelectric substrate 10.

In addition, the fourth embodiment bonds the lower surface 12 of the piezoelectric substrate 10 on the upper surface 34 of the support substrate 30, and then forms an IDT on the piezoelectric substrate 10 as illustrated in FIG. 12A through FIG. 12D. Then, the piezoelectric substrate 10 is irradiated with the laser beam 52 from the lower surface 32 side of the support substrate 30 to form the reforming regions 18. This manufacturing method can also use the IDT as an aligning marker, and can easily form the reforming regions 18 in the piezoelectric substrate 10 under the IDT as with the manufacturing method of the first embodiment illustrated in FIG. 4A through FIG. 4C.

The fourth embodiment has described an exemplary case where the piezoelectric substrate 10 is a 42° rotated Y-cut X-propagation LT substrate, but the piezoelectric substrate 10 may be a 36° to 48° rotated Y-cut X-propagation LT substrate or a 68° or 128° rotated Y-cut X-propagation LN substrate. In a rotated Y-cut X-propagation LT substrate and a rotated Y-cut X-propagation LN substrate, the linear expansion coefficient in the X-axis direction of the crystal orientation (in the first direction) is greater than the linear expansion coefficient in a direction intersecting the X-axis direction (the second direction). In addition, the support substrate 30 is not limited to a sapphire substrate, and may be, for example, a spinel substrate. The spinel substrate also has approximately identical linear expansion coefficients in the first direction and the second direction as with the sapphire substrate.

The configurations of the first through fourth variations of the first embodiment, the second embodiment, and the third embodiment may be applied to the fourth embodiment.

In the first through fourth embodiments, the series resonator and/or the parallel resonator is not limited to a surface acoustic wave resonator, and may be a Love wave resonator or a boundary acoustic wave resonator. The acoustic wave device is not limited to a ladder-type filter, and may be a multimode type filter, or other filter, or a resonator.

Although the embodiments of the present invention have been described in detail, it is to be understood that the various change, substitutions, and alterations could be made hereto without departing from the spirit and scope of the invention.

What is claimed is:

1. An acoustic wave device comprising:
   a single piezoelectric substrate;
   an IDT that is formed on the single piezoelectric substrate and includes a pair of comb-shaped electrodes facing each other, each of the pair of comb-shaped electrodes including a grating electrode that excites an acoustic wave and a bus bar to which the grating electrode is connected; and
   reforming regions that are located only inside the single piezoelectric substrate and arranged at intervals each other under the IDT, and in which a material of the single piezoelectric substrate is reformed,
   wherein the reforming regions have an amorphous structure.

2. The acoustic wave device according to claim 1, wherein the reforming regions are dotted in the single piezoelectric substrate immediately under the IDT.

3. The acoustic wave device according to claim 2, wherein the reforming regions are located along a line in a direction different from a cleavage direction of the single piezoelectric substrate.

4. The acoustic wave device according to claim 2, wherein the reforming regions are located along a line in a different direction from a cleavage direction of the single piezoelectric substrate, and forms a first reforming region group and a second reforming region group located in a direction intersecting the different direction, and
   the reforming regions of the first reforming region group is located so as not to overlap with the reforming regions of the second reforming region group as viewed from the direction intersecting the different direction.

5. The acoustic wave device according to claim 2, wherein the reforming regions are located at two or more different depths in the single piezoelectric substrate.

6. The acoustic wave device according to claim 2, wherein the single piezoelectric substrate is a rotated Y-cut X-propagation lithium tantalate substrate or a rotated Y-cut X-propagation lithium niobate substrate, and
   the reforming regions are located along a line in an X-axis direction of a crystal orientation of the single piezoelectric substrate.

7. The acoustic wave device according to claim 1, further comprising:
   a support substrate of which an upper surface is bonded on a lower surface of the single piezoelectric substrate.

8. The acoustic wave device according to claim 7, wherein the reforming regions are dotted in the single piezoelectric substrate immediately under the IDT,
   the single piezoelectric substrate has a linear expansion coefficient in a first direction greater than a linear expansion coefficient in a second direction intersecting the first direction,
   the support substrate has linear expansion coefficients in the first direction and the second direction approximately equal to each other, and
   the reforming regions are located along a line in the first direction.

9. The acoustic wave device according to claim 8, wherein the single piezoelectric substrate is a rotated Y-cut X-propagation lithium tantalate substrate or a rotated Y-cut X-propagation lithium niobate substrate,
   the support substrate is a sapphire substrate or a spinel substrate, and
   the first direction is an X-axis direction of a crystal orientation of the piezoelectric substrate.

10. The acoustic device according to claim 1, wherein the reforming regions are located approximately at a same depth in the single piezoelectric substrate, and
    an interval between the reforming regions in a plane direction of a surface of the single piezoelectric substrate on which the IDT is formed is less than a wavelength of a bulk wave propagating through an inside of the single piezoelectric substrate.

11. The acoustic wave device according to claim 1, wherein
    the reforming regions are located along a straight line in a propagation direction of the acoustic wave, forms a first reforming region group and a second reforming region group located side by side as viewed from a direction perpendicular to a surface of the single piezoelectric substrate on which the IDT is formed, and are not located between the first reforming region group and the second reforming region group.

12. The acoustic wave device according to claim 10, wherein
    the reforming regions are located near a center of the IDT in a direction intersecting the propagation direction of the acoustic wave.

13. The acoustic wave device according to claim 1, wherein
    the reforming regions are located along a straight line in a direction intersecting a propagation direction of the acoustic wave, forms a first reforming region group and a second reforming region group located side by side as viewed from a direction perpendicular to a surface of the single piezoelectric substrate on which the IDT is formed, and are not located between the first reforming region group and the second reforming region group.

14. The acoustic wave device according to claim 1, wherein
 the reforming regions are located along a straight line in a direction orthogonal to a propagation direction of the acoustic wave, forms a first reforming region group and a second reforming region group located side by side as viewed from a direction perpendicular to a surface of the single piezoelectric substrate on which the IDT is formed, and are not located between the first reforming region group and the second reforming region group.

* * * * *